(12) United States Patent
Chaoui

(10) Patent No.: US 8,724,831 B2
(45) Date of Patent: May 13, 2014

(54) AMPLIFICATION CIRCUIT AND METHOD THEREFOR

(75) Inventor: Hassan Chaoui, Toulouse (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1344 days.

(21) Appl. No.: 11/817,392

(22) PCT Filed: Sep. 11, 2006

(86) PCT No.: PCT/US2006/035072
§ 371 (c)(1),
(2), (4) Date: Mar. 20, 2008

(87) PCT Pub. No.: WO2008/033116
PCT Pub. Date: Mar. 20, 2008

(65) Prior Publication Data
US 2009/0245540 A1   Oct. 1, 2009

(51) Int. Cl.
*H03F 99/00* (2009.01)
*G10H 1/00* (2006.01)

(52) U.S. Cl.
USPC .......................................... 381/120; 381/118

(58) Field of Classification Search
USPC ........................................................ 381/120
See application file for complete search history.

(56) References Cited

U.S. PATENT DOCUMENTS

| | | | |
|---|---|---|---|
| 3,461,406 A * | 8/1969 | Kroll | 341/143 |
| 4,021,745 A | 5/1977 | Suzuki et al. | |
| 4,059,807 A * | 11/1977 | Hamada | 330/10 |
| 4,689,819 A * | 8/1987 | Killion | 381/321 |
| 5,247,581 A * | 9/1993 | Gurcan | 381/321 |
| 5,506,532 A * | 4/1996 | Milazzo | 327/175 |
| 5,815,581 A * | 9/1998 | Andersson | 381/321 |
| 6,304,137 B1 * | 10/2001 | Pullen et al. | 330/10 |
| 6,369,651 B1 * | 4/2002 | Dent | 330/127 |
| 6,621,335 B2 * | 9/2003 | Andersson | 330/10 |
| 7,382,887 B2 * | 6/2008 | Brodkin | 381/94.1 |
| 2002/0070799 A1 * | 6/2002 | Dahan et al. | 330/10 |
| 2003/0122605 A1 * | 7/2003 | Ulrick et al. | 327/309 |
| 2004/0232978 A1 * | 11/2004 | Easson et al. | 330/10 |
| 2005/0012545 A1 * | 1/2005 | Mallinson | 330/10 |
| 2005/0017799 A1 * | 1/2005 | Risbo et al. | 330/10 |
| 2005/0054307 A1 * | 3/2005 | Watts et al. | 455/127.3 |
| 2005/0083114 A1 * | 4/2005 | Risbo | 330/10 |
| 2005/0083116 A1 * | 4/2005 | Risbo et al. | 330/10 |
| 2005/0200405 A1 * | 9/2005 | Shinohara et al. | 330/10 |
| 2005/0231281 A1 * | 10/2005 | Taura et al. | 330/251 |
| 2005/0242878 A1 * | 11/2005 | Mendenhall | 330/251 |
| 2006/0044057 A1 * | 3/2006 | Hezar et al. | 330/10 |
| 2006/0072658 A1 * | 4/2006 | Yasuda et al. | 375/238 |
| 2006/0092063 A1 * | 5/2006 | Ido et al. | 341/144 |
| 2006/0103458 A1 * | 5/2006 | Hansen et al. | 330/10 |
| 2006/0197596 A1 | 9/2006 | Chen et al. | |
| 2006/0226904 A1 * | 10/2006 | Nalbant | 330/251 |
| 2006/0232457 A1 * | 10/2006 | Kishida | 341/143 |
| 2006/0238241 A1 * | 10/2006 | Pearce et al. | 330/10 |
| 2007/0019350 A1 * | 1/2007 | Blackwell | 361/93.1 |
| 2007/0024365 A1 * | 2/2007 | Ramaswamy et al. | 330/251 |
| 2007/0057721 A1 * | 3/2007 | Risbo et al. | 330/10 |
| 2007/0069930 A1 * | 3/2007 | Butler | 341/143 |
| 2007/0290743 A1 * | 12/2007 | Liu et al. | 330/51 |
| 2009/0028361 A1 * | 1/2009 | Risbo et al. | 381/121 |

* cited by examiner

*Primary Examiner* — Matthew Landau
*Assistant Examiner* — Igwe U Anya
(74) *Attorney, Agent, or Firm* — Robert F. Hightower

(57) ABSTRACT

In one embodiment, an amplification circuit receives an analog signal and adds another signal to the analog signal to modify the minimum amplitude of the analog input signal.

16 Claims, 2 Drawing Sheets

$V_b$ $V_{38}$ $V_m$

US 8,724,831 B2

AMPLIFICATION CIRCUIT AND METHOD THEREFOR

BACKGROUND OF THE INVENTION

The present invention relates, in general, to electronics, and more particularly, to methods of forming semiconductor devices and structures.

In the past, the semiconductor industry utilized various methods and structures to produce class-D amplifiers. The prior class-D amplifiers had various applications such as audio power amplifiers for cellular phones. In such applications, the class-D amplifier converted an analog signal to a digital signal and used the digital signal to switch a load with digital switches. One example of such a class-D amplifier was disclosed in U.S. Pat. No. 6,614,297 issued to Score et al on Sep. 2, 2003. One problem with these prior class-D amplifiers was electromagnetic interference (EMI). If the value of the audio input signal was zero or close to zero, small amounts of noise on the audio input signal resulted in high frequency noise radiating from the output of the class-D amplifier.

Some methods to reduce the EMI involved the use of digital logic elements in the digital logic portion of the class-D amplifier. One example of such digital logic is disclosed in U.S. Pat. No. 6,847,257 issued to Edwards et al on Jan. 25, 2005. The digital logic elements of these class-D amplifiers removed all noise above a certain frequency which resulted in removing even audio sounds. This resulted in periods of complete silence during portions of some audio signals. The periods of silence often made uses of the audio equipment, such as a cellular phone, think the equipment was not operating properly.

Accordingly, it is desirable to have a class-D amplifier that has reduced electromagnetic interference without removing audio signals.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
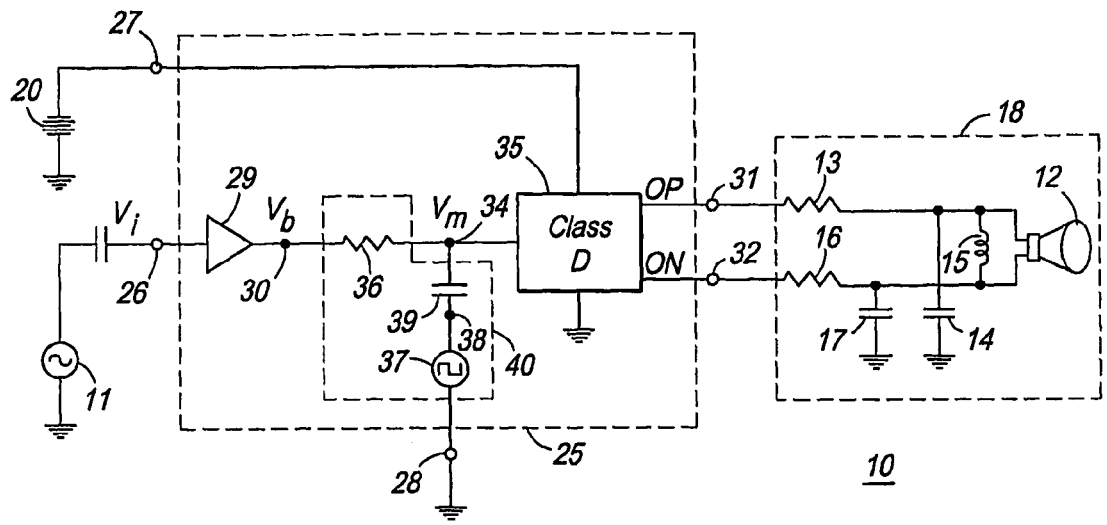
FIG. 1 schematically illustrates an embodiment of a portion of an audio system that includes an exemplary embodiment of an amplification circuit in accordance with the present invention.

FIG. 1 schematically illustrates an embodiment of a portion of an audio system 10 that includes an exemplary embodiment of an amplification circuit 25. Amplification circuit 25 is configured to receive an analog input signal (Vi) on a signal input 26 and responsively form output signals to differentially drive a load 18. For the exemplary embodiment of system 10 illustrated in FIG. 1, load 18 includes an audio speaker 12. Speaker 12 typically is an inductive speaker that may be modeled by an inductor 15, resistors 13 and 16, and capacitors 14 and 17. Those skilled in the art will appreciate that circuit 25 may be used for other applications and that load 18 may be another type of load. For example, speaker 12 may be a different type of speaker or speaker 12 may be replaced by a motor or an audio display such as a display of a cellular phone. Those skilled in the art will also appreciate that load 18 may have other impedance components that are not shown.

Circuit 25 is connected to receive an input voltage for operating circuit 25 between a voltage input 27 and a voltage return 28. Input 27 and return 28 generally are connected to a voltage supply, such as a battery 20. Circuit 25 includes a modulation circuit 40 and also generally includes a buffer amplifier 29 and a class-D amplifier 35. Buffer amplifier 29 receives the input signal (Vi) from input 26 and forms a buffered signal (Vb) that is representative of the input signal (Vi). Amplifier 29 also buffers the input signal from other elements of circuit 25. Modulation circuit 40 generally includes a signal generator 37, and an analog adder. In the exemplary embodiment of circuit 25 illustrated in FIG. 1, a resistor 36 and a capacitor 39 are illustrated as an exemplary embodiment of the analog adder. Typically, the output of amplifier 29 has a low impedance that drives resistor 36 with the Vb signal. Such a configuration facilitates using resistor 36 and capacitor 49 as the adder circuit. Those skilled in the art will appreciate that various other circuits, such as an operational amplifier or a switched capacitor circuit may be used to implement the analog adder. Amplifier 35 may be any of a variety of well-known class-D amplifiers. Amplifier 35 usually includes a pulse width modulated (PWM) circuit (not shown) that converts an analog signal into two pulse width modulated (PWM) signals. The PWM circuit typically includes a sawtooth signal generator and two comparators that are configured to receive the analog signal and the sawtooth signal, and form the two PWM signals. Amplifier 35 may also include an H-bridge driver that receives the two PWM signals and drives the output signals OP and ON. Such class-D amplifiers are well known to those skilled in the art.

Figure 2:
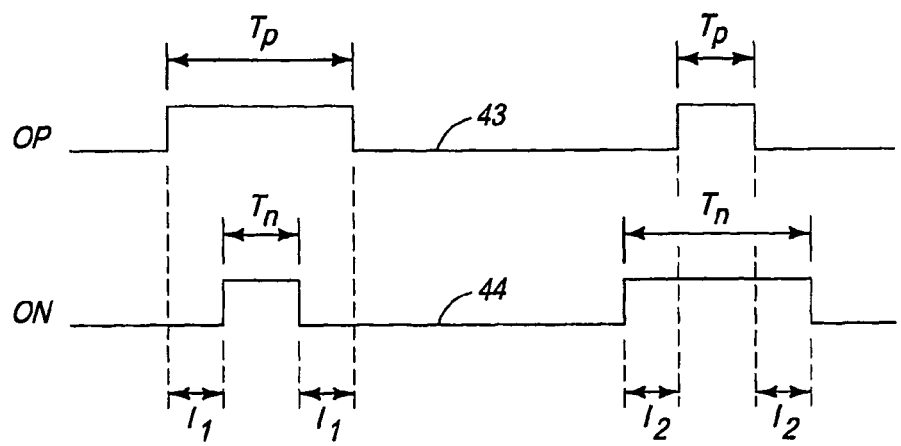
FIG. 2 is a signal diagram illustrating a relationship between some signals of the amplification circuit of FIG. 1 in accordance with the present invention.

FIG. 2 is a signal diagram illustrating two relationships between output signals OP and ON of circuit 25. A plot 43 illustrates the signals on output OP and a plot 44 illustrates the signals on output ON. This description has references to FIGS. 1 and 2. As is well known to those skilled in the art, a class-D amplifier, such as amplifier 35 forms output signals, such as signals OP and ON, based on the amplitude of the input signal received by the amplifier. For amplifier 35, the pulse width of the positive OP signal on output 31 has a pulse width Tp and the pulse width of the negative ON signal on output 32 has a pulse width Tn (See FIG. 2). When the amplitude of the input signal is greater than the midpoint of the input signal, a first pulse is formed on the positive output, e.g. OP, and the width of the pulse, e.g. Tp, is determined by the amount that the amplitude exceeds the mid-point. Also, a second pulse is formed on the negative output, e.g. ON, and the width of the pulse, e.g. Tn, is determined by the amount that the amplitude exceeds the mid-point. For this type of input signal, Tp is greater than Tn. Similarly, when the amplitude of the input signal is less than the midpoint of the input signal, a third pulse is formed on the negative output, e.g. ON, and the width of the pulse, e.g. Tn, is determined by the amount that the amplitude is less than the mid-point. Also, a fourth pulse is formed on the positive output, e.g. OP, and the width of the pulse (Tp) is determined by the amount that the amplitude is less than the mid-point. For this type of input signal, Tn is greater than Tp. As long as the OP and ON signals have the same polarity, no current flows through speaker 12. The only time current flows through speaker 12 is when the signals have opposite polarity. During the portion of the OP and ON signals labeled as I1, OP is high and ON is low and the signals have different polarities. The different polarities cause a potential across speaker 12 and a pulse of current flows through speaker 12. Similarly, during the portion of the OP and ON signals labeled as I2, OP is low and ON is high and the signals have different polarities. The different polarities cause a potential across speaker 12 and pulse of current flows through speaker 12. These portions of the signals when the signals have opposite polarity is referred to as the difference of the OP and ON signals or signal difference.

In the prior art circuits, the current that flowed during the I1 and I2 portion of the signals could cause EMI due to the narrow width of the current pulse that flowed during I1 or I2.

As will be seen further hereinafter, circuit 25 is configured to ensure that the minimum width of the current pulse that flows during I1 or I2 is wide enough to ensure that the EMI has a frequency spectrum that is below a target value, such as thirty mega-hertz (30 Mhz). As can be seen from FIG. 2, this means keeping the width of I1 or I2 wide enough, for example greater than about thirty three nano-seconds (33 nsec.), to ensure that the EMI has a frequency spectrum that is below about thirty mega-hertz (30 Mhz). Keeping the EMI frequency spectrum below about thirty mega-hertz ensures that no EMI interference could disturb other electronic circuits such as internal components within electronic equipment such as an FM tuner or RF power amplifier inside a cell phone or the like. Circuit 25 controls the width of I1 and I2 by modulating the Vb signal from amplifier 29, thus the audio input signal (Vi), with a modulation signal to form a modulated signal (Vm). The modulation signal is formed by generator 37 at a node 38. The modulation signal at node 38 (V38) generally has a frequency that is higher than the generally understood highest frequency that can be perceived by humans, generally regarded as about twenty kilo-hertz (20 Khz). This frequency ensures that the modulation signal is not in the audible frequency range and can not be heard. Signal generator 37 may be any well known circuit that generates an analog or digital signal at a desired maximum voltage value such as an RC oscillator or a Gm-C oscillator and preferably is a ring oscillator.

Circuit 25 receives the analog audio signal from an external source 11 as the audio input signal (Vi) on an input 26. A decoupling capacitor usually is inserted between source 11 and input 26 to block DC voltage from input 26. Amplifier 29 receives Vi and forms Vb as representative of Vi. Amplifier 29 forms Vb to vary around a common mode voltage so that Vb has positive and negative excursions around the common mode voltage. Signal generator 37 forms the modulation signal (V38) on an output of generator 37 at a node 38. The modulation signal formed by generator 37 generally has an amplitude that facilities ensuring that class-D amplifier 35 forms width I1 and I2 of the difference signals wide enough to ensure that the EMI has a frequency spectrum that is below about thirty mega-hertz (30 Mhz). The analog adder of resistor 36 and capacitor 39 adds the modulation signal from node 38 to the buffered signal (Vb) to form the modulated signal (Vm) at a node 34. The peak-to-peak amplitude of the modulation signal (V38) adds to the Vb signal to form a minimum peak-to-peak amplitude for Vm that is no less than a target value that keeps the EMI frequency spectrum below about 30 Mhz. Class-D amplifier 35 receives the modulated signal (Vm) and forms digital output signals OP and ON.

Figure 3:
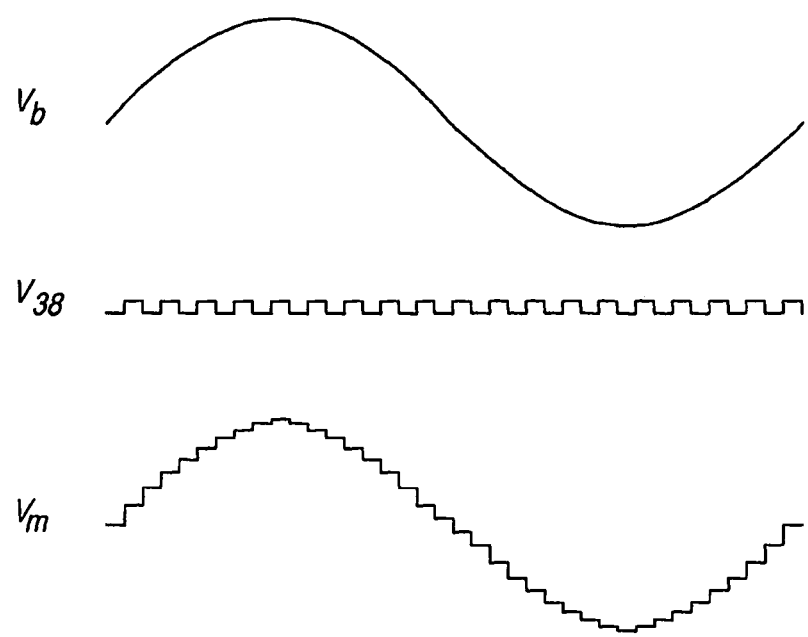
FIG. 3 is a signal diagram illustrating a relationship between some other signals of the amplification circuit of FIG. 1 in accordance with the present invention.

FIG. 3 is a signal diagram illustrating in a general manner the Vb, V38, and Vm signals of circuit 25. The modulation signal (V38) is represented by the waveform labeled as V38. The modulated signal (Vm) on node 34 is illustrated in FIG. 3 by the waveform labeled Vm. This description has references to FIGS. 1-3. The width (T) of I1 or I2, is given by the equation below:

$$T=(G \times Vm)/(2*(Fe \times Vp))$$

where;
T=the width (I1 or I2) of the difference pulses,
G=the gain of amplifier 35,
Vm=the value of the modulated signal on node 34 relative to the common mode voltage,
Fe=the frequency at which amplifier 35 samples signal Vm, and
Vp=the value of the voltage used to operate amplifier 35 (the voltage between input 27 and return 28).

As can be seen from the equation, the width (T) of I1 or I2 is a function of the value of the Vm signal received by amplifier 35. Adding the modulation signal to Vb forms the modulated signal on node Vm to have a non-zero minimum peak-to-peak value. Consequently, even if Vi, thus Vb, has a value of zero, Vm still has a non-zero minimum peak-to-peak value that is substantially equal to the peak-to-peak value of the modulation signal. The maximum peak-to-peak amplitude of the modulation signal V38 is chosen to ensure that the width (T) of I1 and I2 is greater than approximately thirty three nano-seconds (33 nsec.) in order to keep the EMI frequency spectrum below about thirty mega-hertz (30 Mhz) when the value of the input signal Vi, thus the value of Vb, is zero. This ensures that the width (T) of I1 and I2 to keeps the EMI frequency spectrum below about thirty mega-hertz (30 Mhz) for any value of the input signal Vi, thus any value of Vb.

In one example embodiment, the modulation signal generated by generator 37 was a square wave having an amplitude of approximately ten milli-volts (10 mv) resulting in a minimum peak-to-peak amplitude for signal Vm of about ten milli-volts (10 mv). For this example, the gain (G) was six (6), the sampling frequency (Fe) was two hundred fifty Kilo-Hertz (250 Khz), and the input voltage (Vp) was about 3.6 volts resulting in the minimum width of I1 or I2 being approximately thirty three nano-seconds (33 nsec.). Those skilled in the art will appreciate that the waveform of the modulation signal at node 38 may have a variety of waveshapes including a squarewave, a sinewave, a triangle wave, or other waveshape.

In order to assist in implementing this functionality for circuit 25, input 26 is connected to an input of amplifier 29 which has an output connected to a node 30. A first terminal of resistor 36 is connected to node 30 and a second terminal is connected to node 34. An output of modulation circuit 40 is connected to node 34. A first terminal of capacitor 39 is connected to node 34 and a second terminal is connected to node 38. An output of generator 37 is connected to node 38.

Generator 37 is connected between input 27 and return 28 in order to receive operating power. An input of amplifier 35 is connected to node 34. A first output of amplifier 35 is connected to output 31 and a second output is connected to output 32. Amplifier 35 and amplifier 29 are connected between input 27 and return 28 in order to receive power for operating amplifier 35 and amplifier 29.

Figure 4:
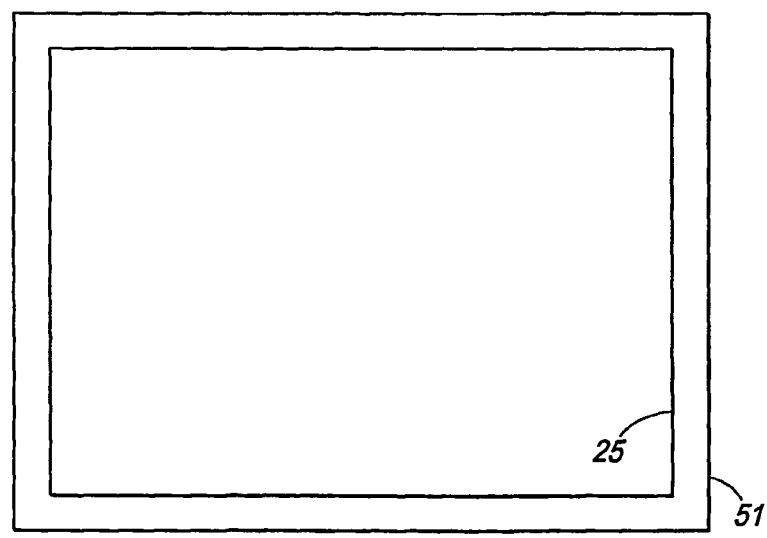
FIG. 4 schematically illustrates an enlarged plan view of a semiconductor device that includes the amplification circuit of FIG. 1 in accordance with the present invention.

FIG. 4 schematically illustrates an enlarged plan view of apportion of an embodiment of a semiconductor device or integrated circuit 50 that is formed on a semiconductor die 51. Circuit 25 is formed on die 51. Die 51 may also include other circuits that are not shown in FIG. 4 for simplicity of the drawing. Circuit 25 and device or integrated circuit 50 are formed on die 51 by semiconductor manufacturing techniques that are well known to those skilled in the art.

In view of all of the above, it is evident that a novel device and method is disclosed. Included, among other features, is adding a modulation signal to an input signal to adjust the amplitude of the input signal. Adding the modulation signal ensures that the modulated signal has a non-zero value for the minimum peak-to-peak amplitude that is received by a class-D amplifier. Adding the modulation signal also forms the amplitude of the adjusted signal to be sufficient to ensure that pulses formed by the class-D amplifier have a frequency spectrum that is below about thirty (30) Mhz.

While the subject matter of the invention is described with specific preferred embodiments, it is evident that many alternatives and variations will be apparent to those skilled in the semiconductor arts. For example the adder may be any well know adder circuit. The signal generator 37 may be any well-known signal generator circuit. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An amplification circuit comprising:
   an input configured to receive an audio input signal;
   a signal generator configured to form a modulation signal having frequencies that are no less than twenty kilohertz;
   an adder circuit coupled to combine the modulation signal with the audio input signal wherein the modulation signal has a non-zero peak-to-peak amplitude so that the modulated signal has a non-zero minimum peak-to-peak amplitude for values of the audio input signal that are approximately zero; and
   a class-D amplifier coupled to receive an output of the adder circuit, and drive an output of the amplification circuit wherein the non-zero amplitude of the modulation signal causes the class-D amplifier to form a signal difference having a different polarity pulse width of never less than approximately thirty three nano-seconds.

2. The amplification circuit of claim 1 wherein the modulation signal has an amplitude that is at least ten millivolts.

3. The amplification circuit of claim 1 wherein the output of the amplification circuit is configured to drive an audio speaker.

4. The amplification circuit of claim 1 wherein the modulation signal has a waveshape that is substantially a square-wave.

5. The amplification circuit of claim 1 wherein the adder circuit includes a resistor and a capacitor.

6. The amplification circuit of claim 1 wherein the adder circuit includes an operation amplifier.

7. The amplification circuit of claim 1 wherein the non-zero minimum peak-to-peak amplitude of the modulated signal limits an EMI frequency spectrum of an output signal on the output of the amplification circuit below about 30 Mhz.

8. The amplification circuit of claim 1 wherein the non-zero amplitude of the modulation signal causes the class-D amplifier to form signals having a same polarity for a first time interval and having the signal difference having the different polarity pulse width of never less than approximately thirty three nano-seconds.

9. An audio amplification method comprising:
   receiving an audio input signal;
   adding to the audio input signal a modulation signal having a frequency that is no less than approximately twenty kilohertz to form a modulated signal including forming the modulation signal to have a non-zero value so that the modulated signal has a non-zero minimum peak-to-peak amplitude for values of the audio input signal that are approximately zero; and
   amplifying the modulated signal with a class-D amplifier wherein the non-zero amplitude of the modulation signal causes the class-D amplifier to form a signal difference having a pulse width of different polarities for never less than approximately thirty three nano-seconds.

10. The method of claim 9 further including driving an audio speaker with an output of the class-D amplifier.

11. The method of claim 9 wherein adding to the audio input signal a modulation signal includes adding a modulation signal having an amplitude that is no less than approximately ten milli-volts.

12. The method of claim 9 wherein amplifying the modulated signal with the class-D amplifier includes forming the non-zero amplitude of the modulation signal to cause the class-D amplifier to form signals having a same polarity for a first time interval and to form the signal difference having the pulse width of different polarities for never less than approximately thirty three nano-seconds.

13. A method of forming an amplification circuit comprising:
   configuring the amplification circuit to receive an audio signal;
   configuring a modulation circuit to modulate the audio signal with a modulation signal having a frequency no less than approximately twenty kilohertz to form a modulated signal including configuring the modulation circuit to form the modulation signal to have a non-zero amplitude so that the modulated signal has a non-zero minimum peak-to-peak amplitude for values of the audio input signal that are approximately zero; and
   coupling a class-D amplifier to amplify the modulation signal and form a difference signal that has different polarities for never less than 33 nano-seconds.

14. The method of claim 13 wherein configuring the modulation circuit to modulate the audio signal with the modulation signal includes configuring the modulation circuit to form the modulation signal with an amplitude that is no less than approximately ten milli-volts.

15. The method of claim 13 wherein configuring the modulation circuit to modulate the audio signal with the modulation signal includes configuring a signal generator to form the modulation signal and coupling an adder to add the modulation signal to the audio signal.

16. The method of claim 13 wherein coupling the class-D amplifier to amplify the modulation signal includes coupling the class-D amplifier to amplify the modulation signal and form signals having pulses with a same polarity for a first time interval and having the difference signal that has different polarities for never less than 33 nano-seconds.

* * * * *